(12) United States Patent
Chan et al.

(10) Patent No.: US 7,142,064 B2
(45) Date of Patent: Nov. 28, 2006

(54) SRAM RING OSCILLATOR

(75) Inventors: Yuen H. Chan, Poughkeepsie, NY (US); Uma Srinivasan, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 93 days.

(21) Appl. No.: 10/973,366

(22) Filed: Oct. 26, 2004

(65) Prior Publication Data

US 2006/0097802 A1 May 11, 2006

(51) Int. Cl.
*H03K 3/03* (2006.01)
*G01R 23/00* (2006.01)
*G01R 31/26* (2006.01)

(52) U.S. Cl. .......................... 331/57; 331/44; 324/765

(58) Field of Classification Search .................. 331/44, 331/57; 324/765
See application file for complete search history.

(56) References Cited

U.S. PATENT DOCUMENTS 5,039,602 A * 8/1991 Merrill et al. ................ 438/11
5,889,430 A    3/1999 Csanky
5,889,431 A    3/1999 Csanky
6,469,585 B1 * 10/2002 Dai et al. ..................... 331/57
6,535,013 B1   3/2003 Samaan
6,621,358 B1 * 9/2003 Carballo et al. .............. 331/57
6,703,879 B1 * 3/2004 Okuda et al. ............... 327/158
6,734,744 B1   5/2004 Monzel et al.

* cited by examiner

*Primary Examiner*—Benny Lee
*Assistant Examiner*—James Goodley
(74) *Attorney, Agent, or Firm*—Lynn L. Augspurger; Laurence J. Marhoefer

(57) ABSTRACT

An SRAM design evaluation circuit topology has the gates of the SRAM cell pass Gate Field Effect Transistors (FETs) connected to the cross-coupled gates of the inverter pair of the SRAM cell. This evaluation circuit typology is used in a full cell implementation. A series of full cells are interconnected one to another in a loop to form a ring oscillator. The output of the ring is frequency divided and measured to study the read and write behavior of the cell design. Similarly, half-cells, with the gates of their pass gates grounded, are interconnected one to another to form a ring oscillator, the output of which is frequency divided and measured to help isolate pass gate impact on memory function. The modified SRAM cell topology, connected as a ring oscillator in hardware, can be used to fully characterize an SRAM cell design, without the use of peripheral read/write circuitry.

4 Claims, 6 Drawing Sheets

SRAM RING OSCILLATOR

FIELD OF THE INVENTION

This invention relates to a circuit typology for evaluating the design of a Static Random Access Memory (SRAM), and more particularly to a circuit typology that provides AC model characterization of the SRAM design with accurate model to product correlation.

BACKGROUND

SRAM circuit designs are very hard to model accurately because of the small size of the SRAM cell. SRAM performance data, based on traditional modeling and simulation often does not represent the performance of the hardware, it was intended to model and simulate. FET models that are used to model hardware are limited in their application to SRAM cells as these models are based on DC type measurements. These FET models are not accurate in predicting AC Read/Write operations in SRAM memory arrays. There are several reasons for this. SRAM cells are sensitive devices whose performance is greatly affected by process imperfections and process variations. An SRAM cell has unique properties, layout, and often sub-minimum device geometry as compared with other FET integrated circuits. Due to its small device widths, the SRAM is sensitive to process parameter variations, and in addition does not scale well with changes in technology.

Prior art model to hardware correlation for SRAM cells is carried out with SRAM array peripheral circuits in SRAM macros, thereby exercising read, write, and other functional modes of operation. Hence the characterization of the SRAM cell itself is often limited to the accuracy of the peripheral circuits. The prior art does not directly measure SRAM cell AC characteristics from hardware.

SUMMARY OF THE INVENTION

An object of this invention is the provision of an SRAM modeling circuit typology that can fully characterize an SRAM cell, without the need for peripheral read/write circuitry.

Another object of the invention is the provision of small, easy to build, and high yield circuit that provides AC model characterization and accurate model to hardware correlation.

A further object of the invention is the provision of an SRAM modeling circuit typology that can isolate pass gate impact on the memory cell function.

Briefly, this invention contemplates provision of an SRAM design evaluation circuit topology in which the gates of the SRAM cell pass Gate Field Effect Transistors (FETs) are connected to the cross-coupled gates of the inverter pair of the SRAM cell. This evaluation circuit typology is used in a full cell implementation. A series of full cells are interconnected one to another in a loop to form a ring oscillator. The output of the ring is frequency divided and measured to study the read and write behavior of the cell design. Similarly, the half-cells, with the gate of its pass gate grounded, are interconnected one to another to form another ring oscillator, the output of which is frequency divided and measured to help isolate pass gate impact on memory function. The modified SRAM cell topology connected as a ring oscillator in hardware can be used to fully characterize an SRAM cell design, without the use of peripheral read/write circuitry. It provides AC model characterization and accurate model to hardware correlation. It is a simple and small circuit, easy to build and with a high yield. Using it in a ring oscillator enables cycle time measurement, delay and switching characteristics for individual SRAM cells, and for isolation of pass gate and in-board devices and for analysis of each separately. Comparison of high VT and low VT effects on cell performance and performance comparisons among different cell layouts can also be made. In addition, it can be put on chip process/device monitoring structures for product SRAM cell monitoring and characterization.

DESCRIPTION OF THE DRAWINGS

FIG. 5($b$) is a schematic block diagram of part of a full cell SRAM ring oscillator and part of a half cell SRAM ring oscillator with their respective dummy cells.

DETAIL DESCRIPTION OF THE INVENTION

Figure 1:
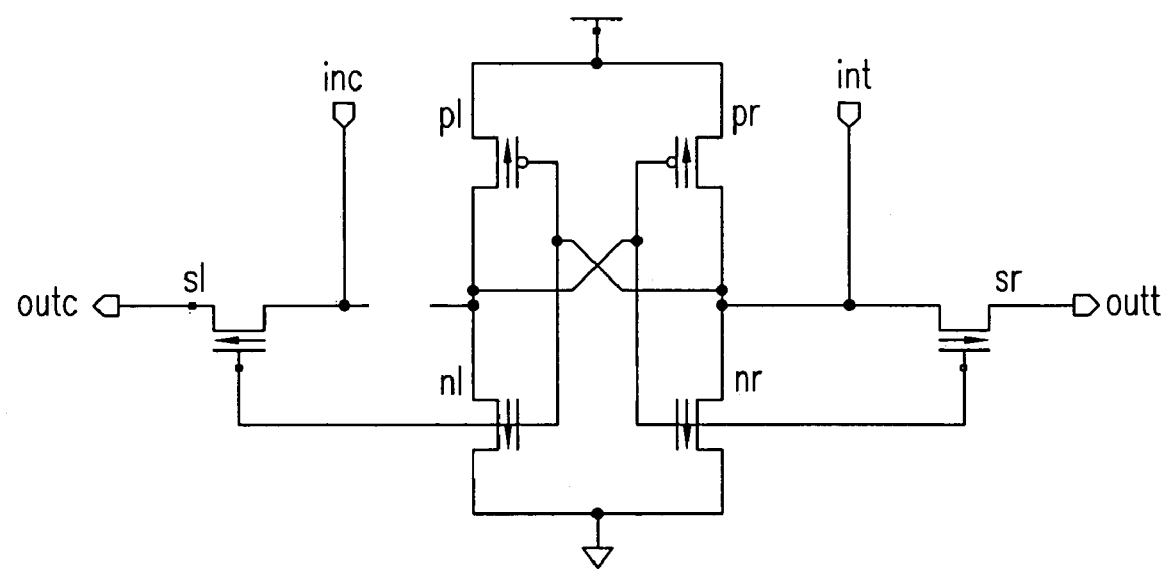
FIG. 1 is a schematic drawing of one embodiment of a full cell circuit topology for evaluating SRAM cell design in accordance with the teachings of this invention.

Referring now to FIG. 1 of the drawings, it shows a typical so called six transistors SRAM cell, modified in accordance with the teachings of this invention. It is comprised of complementary, cross-coupled, FET inverter pairs pl-nl, and pr-nr. But unlike a typical SRAM cell, the pass gates sl and sr of the cell are coupled to the gates of the corresponding cross-coupled inverter pairs, pl-nl and pr-nr, respectively. Coupled as a dual phase, ring oscillator, the two complementary inputs to each cell are int and inc, and the two complementary outputs are outc and outt.

Figure 2:
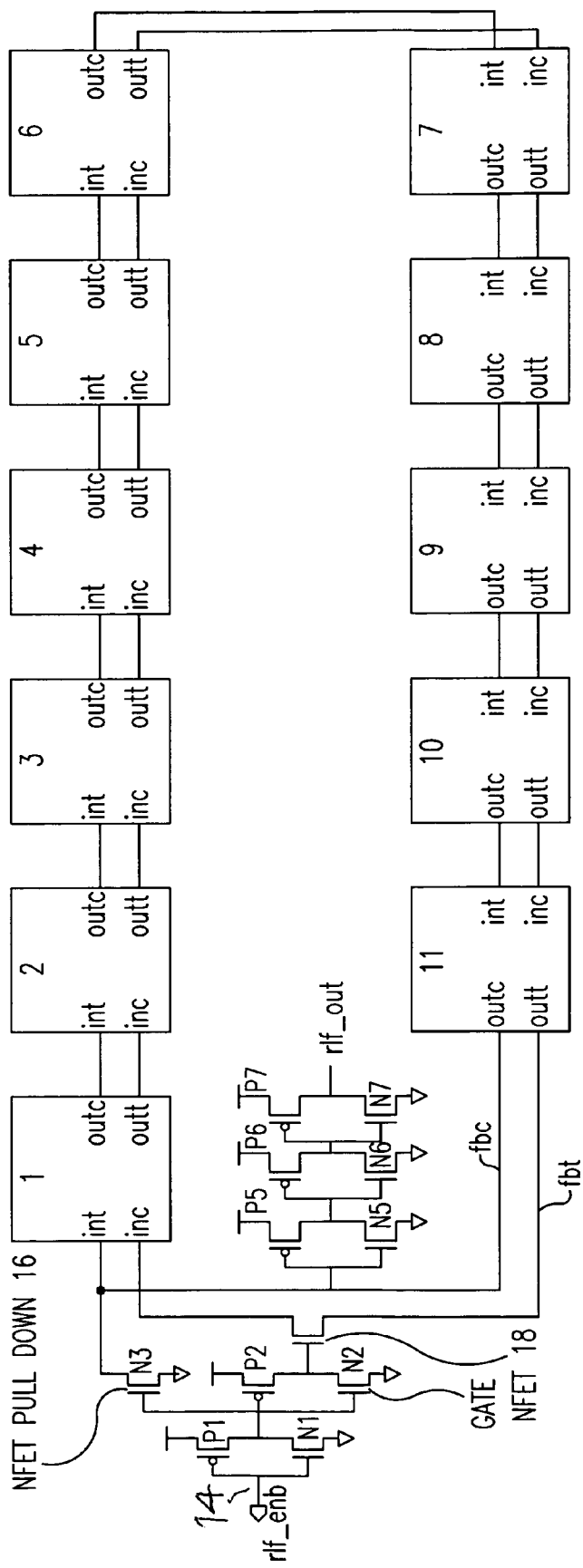
FIG. 2 is a partially schematic and partially block diagram of ring oscillator comprised of full cells of the type described in FIG. 1.

FIG. 2 shows a series eleven SRAM cells, each with the topology shown in FIG. 1, interconnected to form a dual phase ring oscillator. The outputs outc and outt of each cell in the series is coupled to the complementary inputs int and inc respectively of the next cell. That is, the output outt, shown in FIG. 1, of each cell in the series is connected to the input inc of the next cell and the output outc is connected to the input int. The inputs inc and int which are always complement of each other, cause the cross coupled inverter pairs pr-nr and pl-nl to switch to opposite states of int and inc respectively. This appears at the output through the pass gates sr and sl as outt and outc with the same states as int and inc respectively after a delay equal to the pass-gate inverter switching time.

The input to the ring oscillator loop is rlf_enb, which goes from a logic low state to a logic high state to enable the ring oscillator. In response, enabling inputs are coupled to the int and inc inputs of the first SRAM cell via an inverter 14 and transistor 16. In an additional response to the high logic state of rlf_enb, a transistor 18 couples respectively the outputs outt and outc of the last cell of the ring to the inputs inc and int of the first cell. Thus the outputs outt and outc from the last SRAM cell in the ring send respectively true (fbt) and complement (fbc) feed back signals to the first stage of the ring. The output of the ring is rlf_out, and the frequency of this output signal is measured, usually after being frequency divided. As will be appreciated by those skilled in the art, the operating frequency of the ring oscillator shown here is a function of the delay through each SRAM in the ring. This, in turn, provides data as to how well the particular SRAM design under test meets its design objectives. True and complement outputs of eleven stages result in a design equivalent of twenty two inverter delay stages, and provide data that can be used to study the read and write behavior of the cell. It will also be appreciated, that more or fewer stages may be used, as a matter of design choice.

Figure 3:
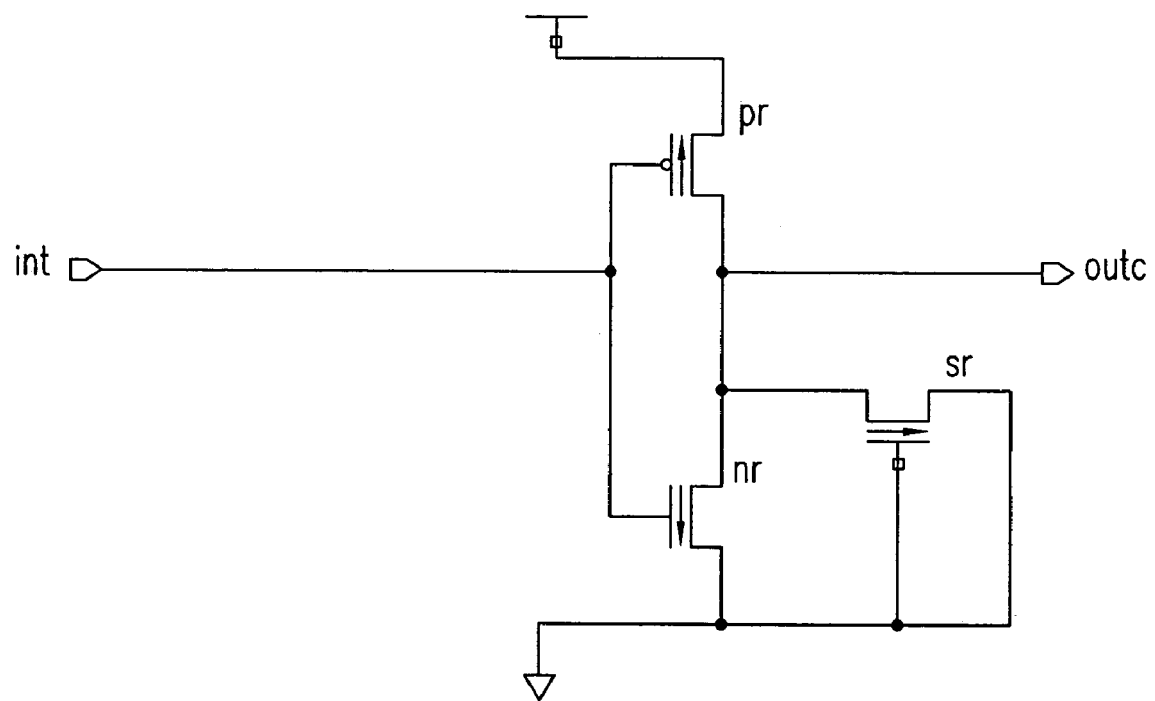
FIG. 3 is a schematic drawing, similar to FIG. 1, of one embodiment of a half-cell circuit topology for evaluating SRAM cell design in accordance with the teachings of this invention.

The decoupled active inverter shown in FIG. 3 is essentially half of a typical SRAM cell of the type shown in FIG. 2, except that its pass gate sr is grounded (shut-off), and its operation is that of a single inverting gate. The input is int and the output is outc. The gate of the pass gate equivalent transistor sr is coupled to ground. The isolated decoupled active inverter helps to isolate pass gate impact on memory cell function. The physical design of the half-cell has the same Polysilicon and local interconnect mask structures around the active inverter so that it is similar to a full cell as implemented in hardware.

Figure 4:
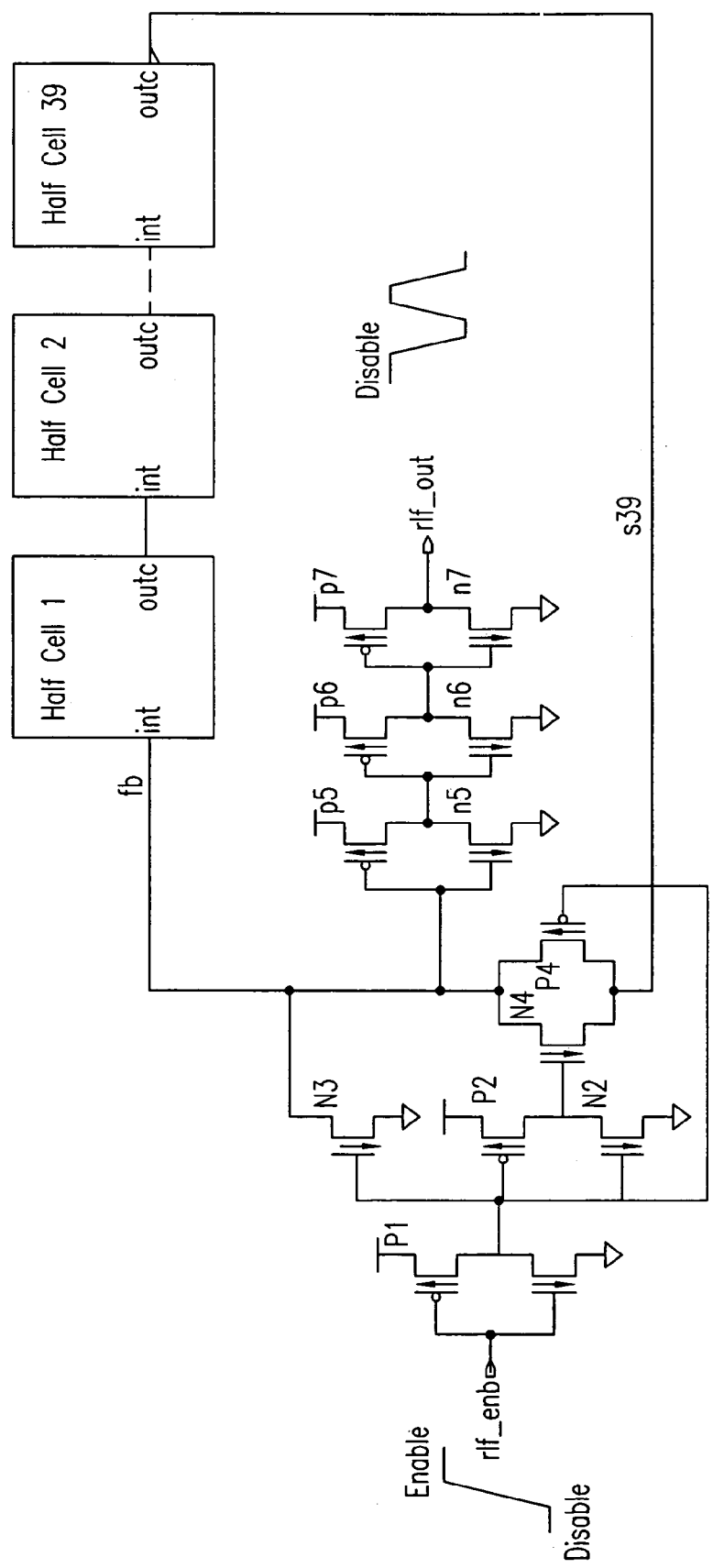
FIG. 4 is a partially schematic and partially block diagram of a ring oscillator comprised of half-cells of the type described in FIG. 3.

Referring now to FIG. 4, as in the case of the full cells in FIG. 2, the half-cells are connected in series to form a ring oscillator, with the output outc of each cell connected to the input int of the next cell in the ring. The output of the last cell of the ring is coupled to the input of the first cell of the ring, as shown. The input to the ring is rlf_enb, which switches from a low logic state to a high logic state to enable the ring oscillator. The output of the ring is rlf_out, which can be frequency divided, and the resultant frequency data outputted for evaluation of the SRAM design. It will be appreciated that the delay per cell in the half-cell ring is less than the delay per cell in the full cell ring. In this embodiment there are 39 half-cell stages, although more or fewer may be used. Delay in the feedback path from the last cell to the first cell due to the complementary gates 22 and 24 is shared across the 39 stages and is therefore negligible.

Figure 5A:
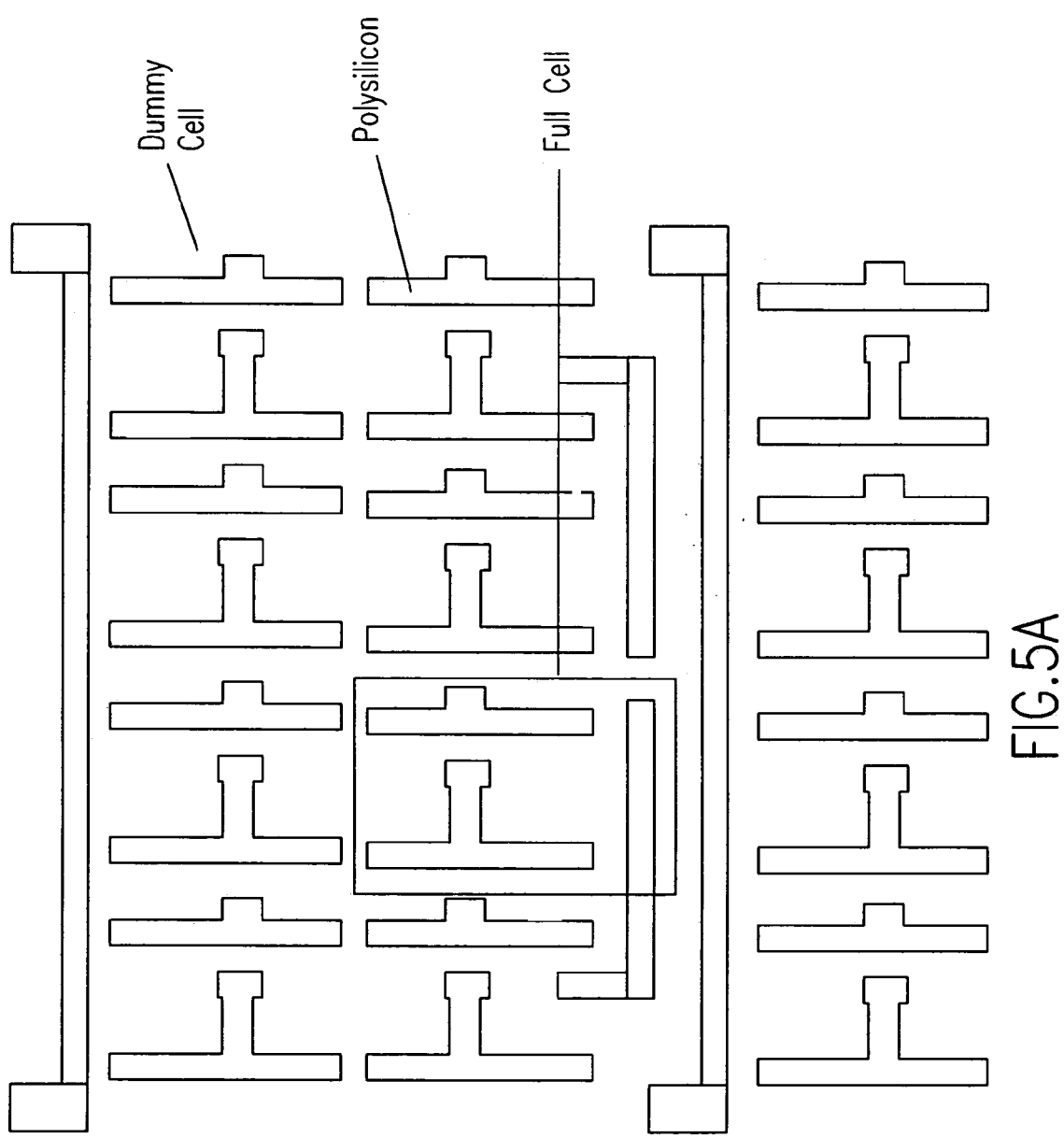
FIG. 5($a$) is a drawing the physical layout of a full cell of the type shown in FIG. 1 implemented as an integrated circuit with surrounding dummy SRAM cells.
Figure 5B:
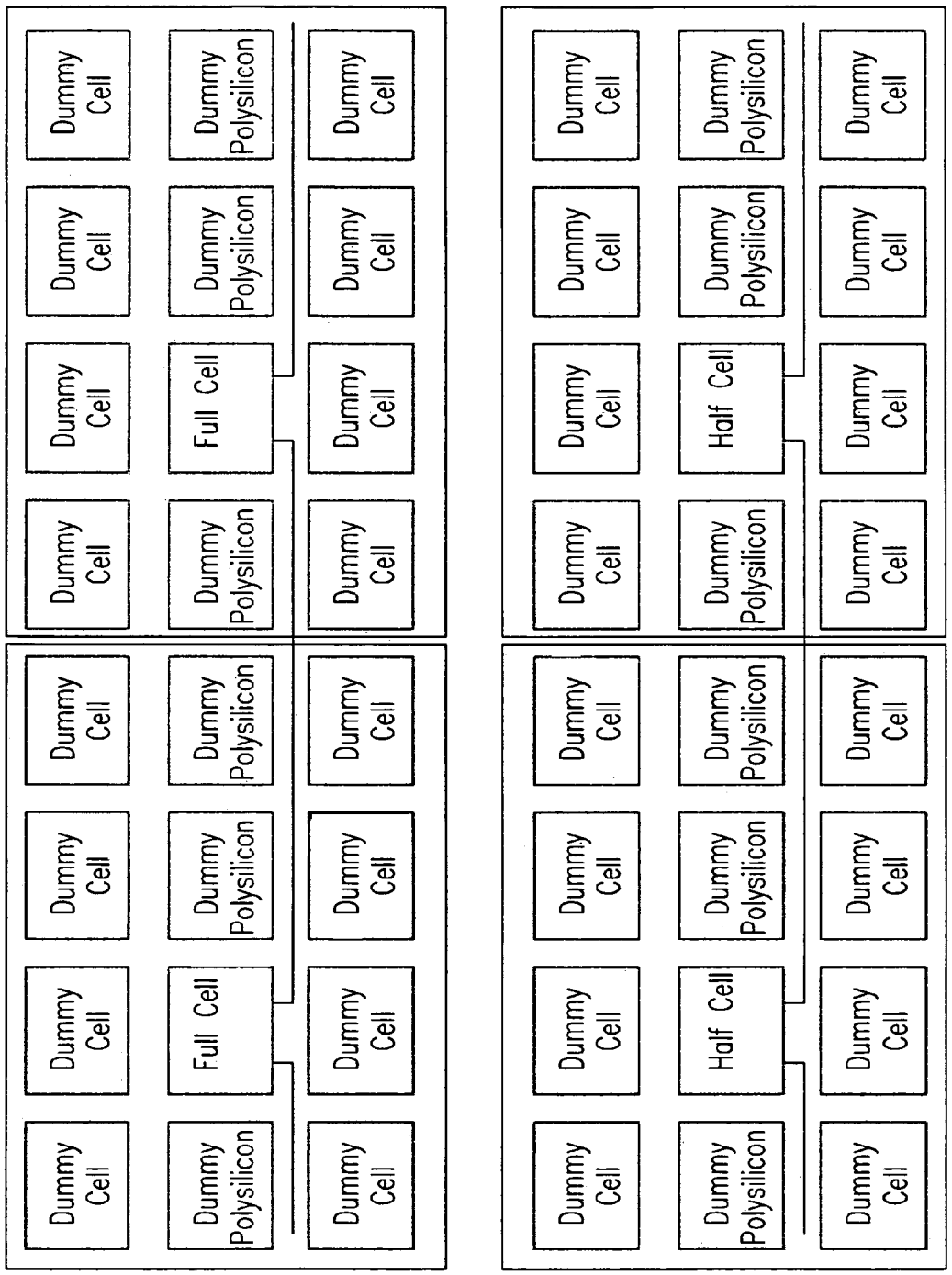

In application, in evaluating an SRAM design, a full cell ring and half-cell ring are formed as a single integrated circuit in a series of process steps. As illustrated in FIGS. 5(a) and 5(b), each full cell and each half-cell in their respective rings, is surrounded by SRAM cells to mimic an array like physical structure, so that the process and mask optical pattern effects are maintained as closed as possible to an actual product array.

While the preferred embodiment of the invention has been described, it will be understood that those skilled in the art, both now and in the future, may make various improvements and enhancements which fall within the scope of the claims which follow. These claims should be construed to maintain the proper protection of the invention described herein.

The invention claimed is:

1. A circuit for evaluating the operation of a SRAM comprising in combination:
   a pair of inverter circuits comprised of FET transistors with respective cross-coupled gate electrodes;
   a first FET transistor pass gate coupled as an input to one of said pair of inverter circuits and a second FET transistor pass gate coupled as an output to the other of said pair of inverter circuits with the gate of said first FET transistor and the gate of said second FET transistor each respectively directly connected to said cross-coupled gate electrodes;
   an input coupled to said one of said pair of inverter circuits and an output coupled to said other of said pair of inverter circuits.

2. A circuit for evaluating the operation of an SRAM as in claim 1 wherein a plurality of circuits is connected to form a ring oscillator.

3. A circuit for evaluating the operation of an SRAM as in claim 1 wherein said circuit is a process/device monitoring circuit.

4. A circuit for evaluating the operation of an SRAM as in claim 2 wherein said circuit is a process/device monitoring circuit.

* * * * *